United States Patent [19]
Finnila

[11] Patent Number: 5,426,072
[45] Date of Patent: Jun. 20, 1995

[54] PROCESS OF MANUFACTURING A THREE DIMENSIONAL INTEGRATED CIRCUIT FROM STACKED SOI WAFERS USING A TEMPORARY SILICON SUBSTRATE

[75] Inventor: Ronald M. Finnila, Carlsbad, Calif.

[73] Assignee: Hughes Aircraft Company, Los Angeles, Calif.

[21] Appl. No.: 6,601

[22] Filed: Jan. 21, 1993

[51] Int. Cl.[6] .................. H01L 21/283; H01L 21/56; H01L 21/58; H01L 21/60
[52] U.S. Cl. .................................. 437/208; 437/915; 437/974; 257/686; 257/700; 257/777
[58] Field of Search .................. 437/208, 915, 974; 257/686, 700, 777

[56] References Cited

U.S. PATENT DOCUMENTS

| | | | |
|---|---|---|---|
| 3,602,981 | 9/1971 | Kooi | 437/974 |
| 3,623,219 | 11/1971 | Stoller et al. | 437/974 |
| 4,022,927 | 5/1977 | Pfeiffer et al. | 427/43 |
| 4,423,435 | 12/1983 | Test, II | 357/65 |
| 4,980,308 | 12/1990 | Hayashi et al. | 437/974 |
| 5,244,817 | 9/1993 | Hawkins et al. | 437/974 |
| 5,279,991 | 1/1994 | Minahan et al. | 437/208 |

FOREIGN PATENT DOCUMENTS

| | | | |
|---|---|---|---|
| 0168815 | 1/1986 | European Pat. Off. . | |
| 0238089 | 9/1987 | European Pat. Off. . | |
| 62-214624 | 9/1987 | Japan | 437/974 |
| 04280456 | 2/1992 | Japan . | |

OTHER PUBLICATIONS

*Microelectronics Packaging Handbook*, New York, Van Nostrand Reinhold, 1989, pp. 372 & 1147. Tk 7874, T824 1988.
"CUBIC (Cumulatively Bonded IC) Devices stacking Thin Film DUAL-CMOS Functional Blocks", Y. Hayashi et al. (1990).
"3-D Chip-on-Chip Stacking", Semiconductor International, Dec. 1991.
Patent Abstracts of Japan, vol. 17, No. 85 (E-1322) 19 Feb. 1992.
Hayashi et al., "Fabrication of three-dimentional IC using Cumulatively Bonded IC (CUBIC) Technology", 1990 Symposium on VLSI Technology, 4 Jun. 1990, Honolulu USA, pp. 95-96.

*Primary Examiner*—Olik Chaudhuri
*Assistant Examiner*—David E. Graybill
*Attorney, Agent, or Firm*—W. C. Schubert; W. K. Denson-Low

[57] ABSTRACT

A method of providing a first and a second Silicon-on-Insulator (SOI) wafer, wherein each SOI wafer includes a silicon layer separated from a bulk silicon substrate by a layer of dielectric material, typically SiO2. Next, at least one electrical feedthrough is formed in each of the silicon layers and active and passive devices are formed in each of the thin silicon layers. Next, interconnects are formed that overlie the silicon layer and are electrically coupled to the feedthrough. One of the wafers is then attached to a temporary substrate such that the interconnects are interposed between the thin silicon layer and the temporary substrate. The bulk silicon substrate of the wafer having the temporary substrate is then etched to expose the dielectric layer. Further interconnects are then formed through the exposed dielectric layer for electrically contacting the at least one feedthrough. This results in the formation of a first circuit assembly. A next step then couples the further interconnects of the circuit assembly to the interconnects of the second SOI wafer, the second SOI wafer having a bulk substrate, a dielectric layer overlying a surface of the substrate, and a layer of processed silicon overlying the dielectric layer. The temporary substrate is then removed. Additional circuit assemblies may then be stacked and interconnected to form a 3d integrated circuit.

24 Claims, 6 Drawing Sheets

PROCESS OF MANUFACTURING A THREE DIMENSIONAL INTEGRATED CIRCUIT FROM STACKED SOI WAFERS USING A TEMPORARY SILICON SUBSTRATE

FIELD OF THE INVENTION

This invention relates generally to integrated circuit manufacturing technology and, in particular, to a method for fabricating a multi-layered, three-dimensional integrated circuit.

BACKGROUND OF THE INVENTION

The fabrication of three-dimensional (3d) integrated circuits has been previously accomplished by several techniques. One approach employs a fabrication technology wherein active silicon films are grown in successive layers with intervening insulating layers. However, this approach must overcome difficult materials problems, and also generally precludes the testing of individual layers of the device. Furthermore, the total fabrication time is proportional to the number of layers, and becomes lengthy for a structure having more than three or four layers of active circuitry.

Another known approach involves the thinning and stacking of conventional integrated circuit dice into cubes, with additional processing to bring metal interconnects out to the edge of the cube. The cubes are then attached and electrically connected to a substrate by the use of solder bumps. However, this approach requires considerable handling of the small dice and therefore incurs high processing costs. Furthermore, all interconnects between the vertically stacked dice must be made at the edges. This tends to limit the operating speed by requiring additional lengths of conductors to bring the signals to and from the edges.

A third approach is described by Hayashi et al., "Fabrication of Three-Dimensional IC Using 'Cumulatively Bonded IC' (CUBIC) Technology", 1990 Symposium on VLSI Technology, which employs a method of thinning and stacking integrated circuit functional blocks and incorporating vertical interconnects between adjacent functional blocks. A supporting substrate is employed to support a Si layer when a Si crystal is removed by a preferential polishing method. The supporting substrate is later removed. A perceived disadvantage to this approach is that the bulk silicon crystal is required to be mechanically thinned down, using a LOCOS-buried $SiO_2$ as a polish stop. This process may be difficult to control in order not to remove the LOCOS-buried $SiO_2$, and cannot be readily applied to technologies other than LOCOS-isolated CMOS. This process also appears to require that the LOCOS-buried $SiO_2$ extend further into the Si than the active devices in the Si. This may present a serious limitation for many applications.

It is thus an object of this invention to overcome these and other problems of the prior art.

It is another object of this invention to provide a novel semiconductor fabrication technology to construct 3d integrated circuits of small volume by stacking Silicon-on-Insulator (SOI) integrated circuit wafers, wherein a silicon substrate is chemically etched away using the buried oxide as an etch stop.

A further object of this invention is to provide a fabrication technology that results in a 3d circuit that supports metal oxide semiconductor (MOS), bipolar, or combination technologies; and that achieves a high circuit density through the use of thin silicon films with small vertical feedthroughs.

SUMMARY OF THE INVENTION

The foregoing and other problems are overcome and the objects of the invention are realized by a novel method for fabricating three dimensional integrated circuits. In a presently preferred embodiment the method includes the steps of providing a first and a second Silicon-on-Insulator (SOI) wafer, wherein each SOI wafer includes a thin silicon layer separated from a bulk silicon substrate by a thin layer of dielectric material, typically $SiO_2$. A next step processes the thin silicon layers to form at least one electrical feedthrough in each of the thin silicon layers and to also form desired active and passive devices in each of the thin silicon layers. A next step forms interconnects that overlie the thin silicon layer and that are electrically coupled to the at least one feedthrough. One of the wafers is then attached to a temporary substrate such that the interconnects are interposed between the thin silicon layer and the temporary substrate. The bulk silicon substrate of the wafer having the temporary substrate is then removed by a step of etching the bulk silicon substrate so as to expose the dielectric layer. Further interconnects are then formed through the exposed dielectric layer for electrically contacting the at least one feedthrough. This results in the formation of a first circuit assembly that includes the processed silicon layer, the interconnects formed over a first major surface (topside surface) of the processed silicon layer, and the further interconnects that are formed over a second major surface (bottomside surface) of the processed silicon layer. A next step then couples the further interconnects of the circuit assembly to the interconnects of a supporting substrate, such as a second SOI wafer having a bulk substrate, a dielectric layer overlying a surface of the substrate, and a layer of processed silicon overlying the dielectric layer. The temporary substrate is then removed. Additional circuit assemblies may then be stacked and interconnected to form a 3d integrated circuit of a desired complexity.

The completed 3d wafer stack may be used in wafer form, or it may be sawed into 3d dice after stacking. Alternatively, individual dice may be cut from a circuit assembly, processed as described above, and stacked to form a 3d structure.

Methods for forming feedthroughs within a Si layer of an SOI wafer are also disclosed.

BRIEF DESCRIPTION OF THE DRAWINGS

The above set forth and other features of the invention are made more apparent in the ensuing Detailed Description of the Invention, when read in conjunction with the attached Drawing, wherein.

DETAILED DESCRIPTION OF THE INVENTION

Figure 1:
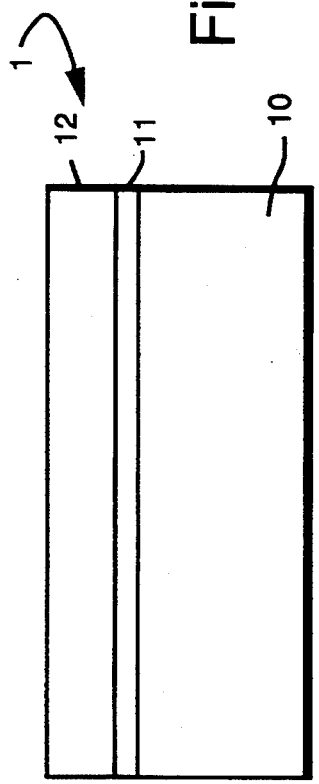
FIGS. 1 through 7, not drawn to scale, are cross-sectional views that illustrate steps of a fabrication method of the invention.

Referring to FIG. 1, a first fabrication step provides an SOI wafer 1 that includes of a silicon film 12 separated from a bulk silicon wafer 10 by an SiO2 layer 11. The presence of the SiO2 layer 11 facilitates the performance of the etching step described below. The thickness of the silicon film 12 is typically within a range of approximately 0.2 micrometers to approximately 10 micrometers. The thickness of the SiO2 layer 11 is not critical, and is typically in the range of approximately 0.1 micrometers to approximately 1.5 micrometers. The thickness of the substrate 10 is approximately 600 micrometers. The overall diameter of the wafer 1 is typically in the range of approximately 100 mm to approximately 200 mm.

A presently preferred method for forming the Si film 12 is by bonding two silicon wafers together with a fused oxide layer, and then thinning one of the wafers to form the thin film Si layer 12. This technique allows optimum control in the thickness and composition of the buried insulator 11, and provides a high quality Si film. It is noted that both wafers need not be crystalline Si. By example, one of the wafers may be polycrystalline Si and the other crystalline Si, with the crystalline Si being thinned to provide the Si film 12 within which active devices are fabricated. Alternatively, SIMOX (Separation by Implanted Oxygen) or ZMR (Zone Melt and Recrystallization) wafers could be used.

It is noted that the SOI wafer 1 can also be purchased commercially.

Figure 9:
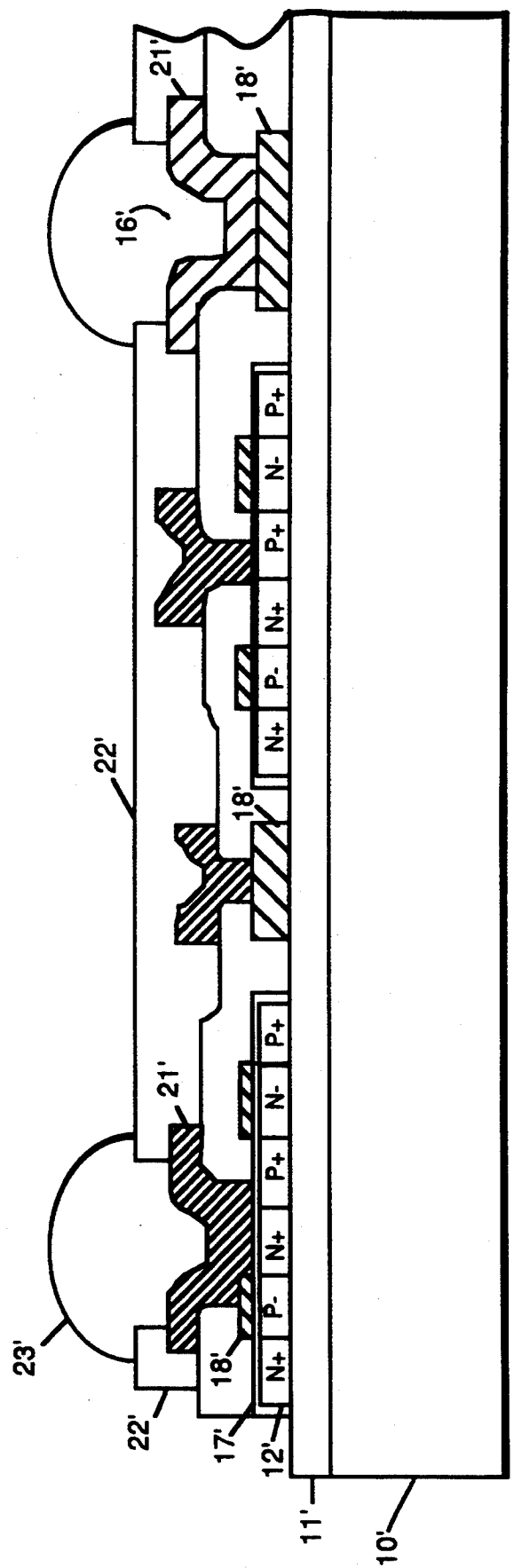
FIGS. 9 and 10, not drawn to scale, are cross-sectional views that illustrate an embodiment of the invention wherein a thin Si film has active device structures that extend through a total thickness of the film.
Figure 10:
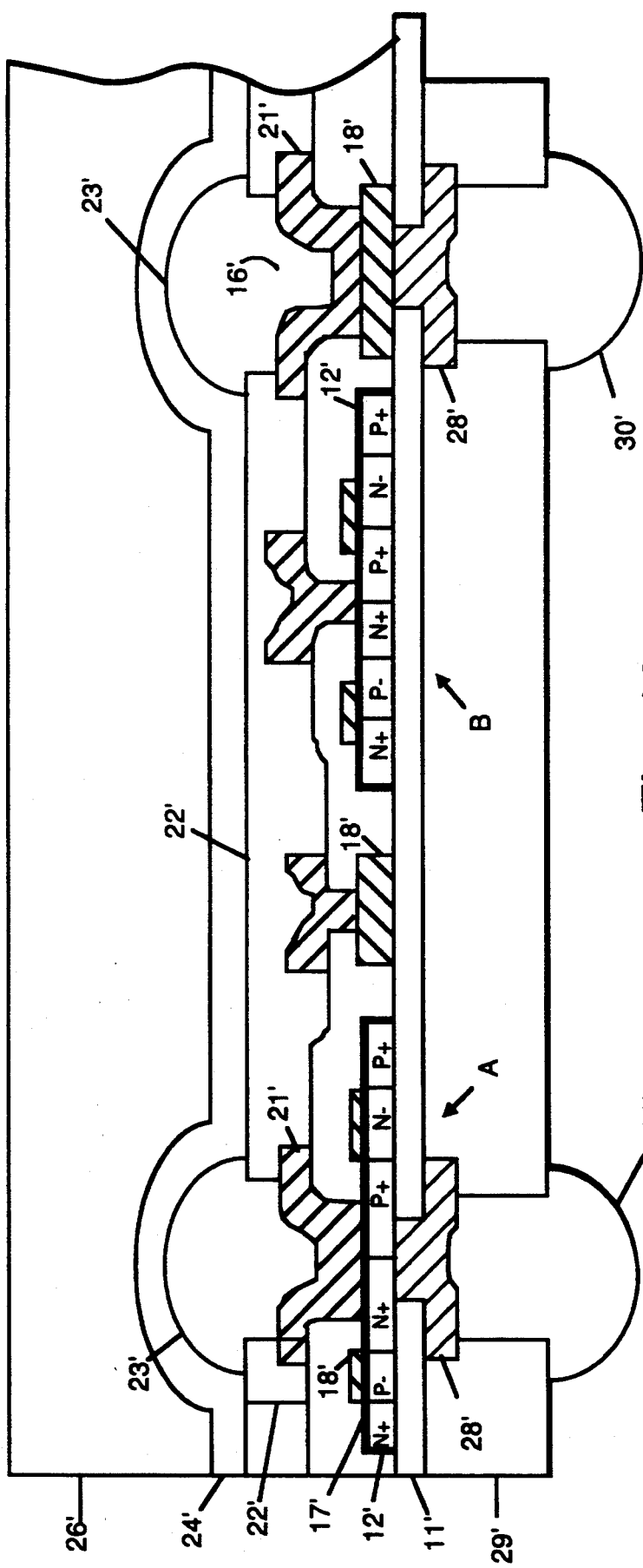

By whatever method the SOI wafer 1 is obtained, the next steps of the process depend upon the thickness of the Si film 12. In general, the Si film 12 can be characterized as being either a "thick" film, having a thickness greater than approximately one micrometer, or a "thin" film having a thickness less than approximately one micrometer. In the thick film case, trenches are formed to provide vertical feedthroughs. In the thin film case, the vertical feedthroughs can be readily formed within gaps made between transistor mesas. FIGS. 2–6 illustrate the thick film case, while FIGS. 9 and 10 illustrate the thin film case.

Figure 2:
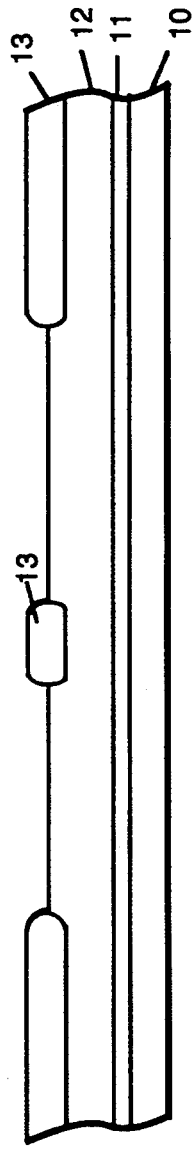

In FIG. 2 a conventional LOCOS process has been employed to form regions of isoplanar SiO2 13 on the surface of the Si layer 12. Transistors can be formed within active areas, that is, areas not covered by the isoplanar oxide 13.

Figure 3:
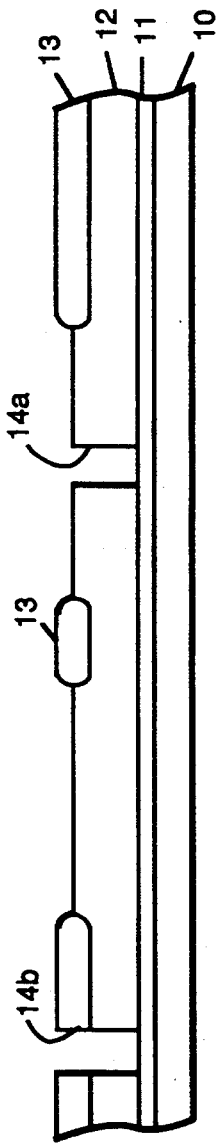

FIG. 3 illustrates the SOI wafer 1 after trenches 14 have been etched by an anisotrophic plasma etch process. Trenches are typically formed both in the active regions (trench 14a) and in the isoplanar field regions (trench 14b) so as to provide optimum vertical interconnect placement flexibility.

Figure 4:
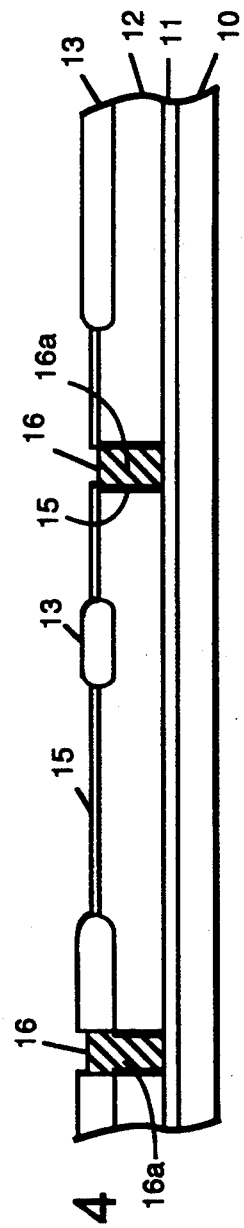

In greater detail, and referring also to FIG. 4, the feedthroughs 16 are formed by etching the trenches 14a and 14b through the silicon layer 12 to the underlying SiO2 layer 11, with the SiO2 layer 11 functioning as an etch stop. The trench walls, and the upper surface of the silicon film 12, are oxidized using a conventional thermal oxidation process to form a dielectric SiO2 layer 15 having a thickness of approximately 0.1 micron. The remaining opening within each trench is then filled with an electrically conductive material 16a. Heavily doped polycrystalline silicon (polysilicon) is a preferred electrically conductive material, although other electrically conductive materials, such as tungsten, may also be employed. Phosphorus or arsenic are the preferred dopants at concentrations sufficient to provide the required conductivity, which may vary depending upon the application.

Alternatively, for the thin film case described below with reference to FIGS. 9 and 10, the feedthroughs result when the Si film 12 is etched to form islands where the transistors will be made. The space between these islands is then available for use by feedthroughs. Furthermore, the diffusions (e.g. source and drain diffusions for MOS transistors) will generally extend completely through the Si layer 12 and may be used as feedthroughs.

In the thick film case each feedthrough 16 includes an electrically conductive member 16a surrounded by an electrically insulating SiO2 region (15).

Figure 5:
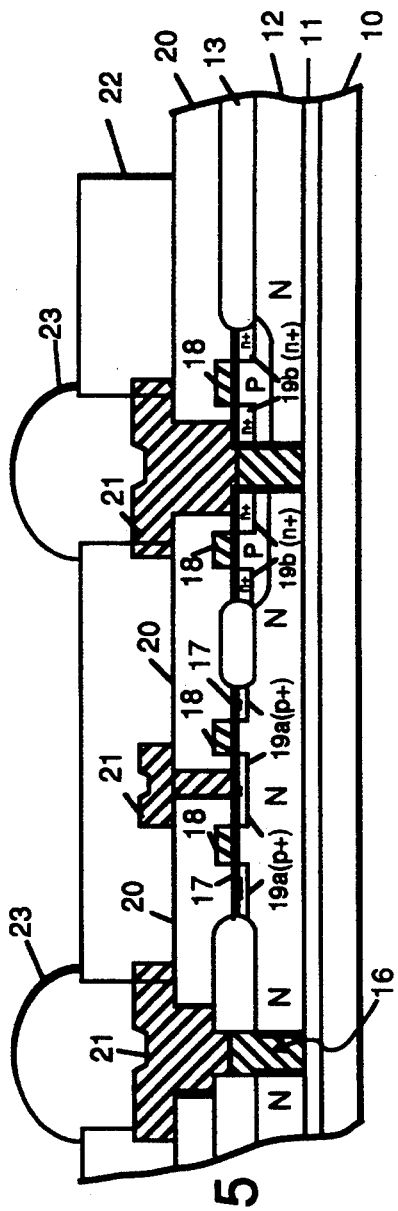

In FIG. 5 the structure formed thus far is processed to form an integrated circuit. A CMOS process is described, but any other process, such as bipolar or bipolar/CMOS, may also be employed. N-type and p-type regions are formed where desired within the silicon film 12. These regions are delineated through a photolithographic process and are formed through a diffusion or an ion implantation step. The sacrificial SiO2 layer 15 is then removed and a further SiO2 layer 17 is formed to serve as the gate oxide, the SiO2 layer 17 being formed by oxidizing the silicon film 12. One or more polysilicon gate electrodes 18 are also deposited, as required, upon the SiO2 layer 17. P+ and n+ regions 19a and 19b, respectively, are then photolithographically defined and diffused or implanted to serve as the source and drain regions of p and n-channel transistors, respectively.

A layer 20 of SiO2 is then deposited over the polysilicon gate electrodes 18. Openings are defined and etched within the SiO2 layer 20, and metalization 21 is deposited so as to contact the conductive feedthroughs 16, the polysilicon electrodes 18, and the p+ and n+ regions 19a and 19b within the silicon film 12. As can be seen, a number of active devices (FETs) are thus formed, as may also be polysilicon resistors and other conventional devices. Additional layers of metal interconnects may also be added (as described below), followed by an insulating overglass layer 22 that is deposited in a conventional manner. Finally, openings are defined and etched into the overglass layer 22, and "topside" indium bumps 23 are formed to contact the metalization 21 within the openings.

It is noted that the indium bumps 23 are located where desired for eventual interconnection to another wafer that is processed as thus far described, and are not required to be located directly over the vertical feedthroughs 16. That is, routing metalization can be applied before the deposition of the overglass layer 22 in order to locate the indium bumps 23 at desired locations.

Figure 6:
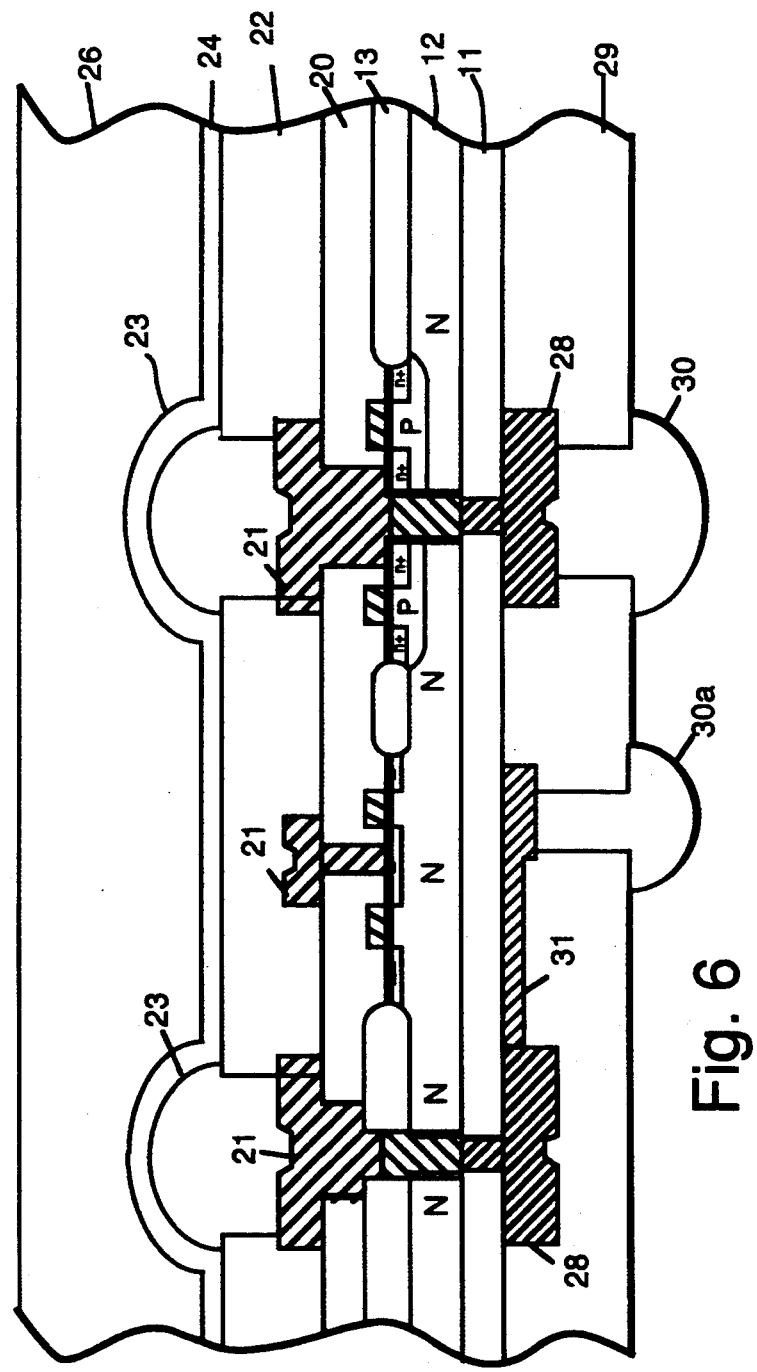

In FIG. 6 a second, temporary substrate 26, typically comprised of Si, is attached to the upper surface of the completed wafer shown in FIG. 5. Other suitable materials for the second substrate 26 include quartz and crystalline Al2O3 (sapphire). A consideration in the choice of material for the second substrate 26 is the coefficient of thermal expansion of the material, if the additional processing steps described below are performed at elevated temperatures. That is, the selected material for the second substrate 26 should have a coefficient of thermal expansion that is similar to that of Si to avoid undue deformation of the Si film 12 when the assembly is heated.

The temporary attachment of the substrate 26 is made with a bonding layer 24 comprised of a wax or a similar material which can be readily removed later. The second substrate 26 provides mechanical support for the silicon layer 12 during the ensuing steps of the method, and has a suitable thickness for providing the required mechanical support.

Next, the first silicon substrate 10 is removed. This is accomplished, in accordance with an aspect of this invention, through the use of an etching process, or a lapping process, to remove a portion of the substrate 10, followed by an etching process. The etchant is chosen so that it stops at the $SiO_2$ layer 11 which separates the silicon substrate 10 from the thin silicon film 12 containing the active and passive circuitry. Suitable etching processes include the use of a hot KOH solution (60° C. to 80° C.) or a plasma etch that is highly selective for Si. As a result, a well controlled and complete removal of the silicon substrate 10 is achieved. If needed, a protective layer, such as a thin layer of epoxy, can be provided around the periphery of the wafer to protect the Si layer 12 during the etching process.

In this regard, the temporary substrate 26 may be provided with a larger diameter than the wafer 1 to facilitate providing the protective layer at the periphery of the wafer 1. For example, if the wafer 1 has a diameter of 100 mm, a suitable diameter for the temporary substrate 26 is 125 mm.

The structure formed thus far is then processed with conventional processing steps to define and etch contact openings in the now exposed dielectric layer 11, followed by the formation of bonding pads 28, typically comprised of aluminum, an overglass layer 29, and "bottomside" indium bumps 30.

This further processing results in the formation of an intermediate structure or circuit assembly having active and passive electrical components located within the silicon layer 12, and topside and bottomside interconnects for coupling to other structures.

In general, one of the bottomside indium bumps 30 will be associated with one of the vertical feedthroughs 16, However, a bottomside indium bump 30 need not be located so as to directly overlie a feedthrough. That is, bottomside metalization can be applied before the application of the overglass layer 29 so as to provide signal routing from the contacts 28 to any desired location on the bottomside surface, thereby enabling the indium bumps 30 to be located at the periphery of the wafer or at any desired location. One such indium bump is shown generally as 30a. The bump 30a is connected to its respective feedthrough 28 through an intervening strip of signal routing metalization 31.

FIGS. 9 and 10 are cross-sectional views that correspond to FIGS. 5 and 6, respectively, for the thin film case wherein the Si layer has a thickness of less than one micrometer, and preferably less than approximately 0.5 micrometers. In FIGS. 9 and 10 the reference numerals that correspond to the reference numerals in FIGS. 5 and 6 are designated with primes.

As can be seen in FIG. 9, the Si layer 12' has been selectively removed down to the $SiO_2$ layer 11'. The remaining Si material forms islands or mesas within which active and passive devices are formed by selective doping. Due to the thinness of the Si layer 12' the doped regions extend completely through the Si layer 12'. A feedthrough 16' is partially formed by depositing a doped polysilicon pad 18' onto the dielectric layer 11' within an area between mesas, and contacting the doped polysilicon pad 18' with metalization 21'.

In FIG. 10 the bulk substrate 10' has been removed and the temporary substrate 26' attached. Furthermore, apertures have been opened in the dielectric layer 11' and bottomside metalization 28' applied, after which the bottomside indium bumps 30' are formed.

As can be seen, in this embodiment of the invention the transistor device generally designated as "A" is electrically contacted from both the topside and the bottomside of the structure. The transistor device generally designated as "B" is not contacted from either the topside or bottomside, although metalization could be provided from either the topside or bottomside surfaces, or from both surfaces as in the case of transistor device A. The feedthrough 16' is formed by opening an aperture within the dielectric layer 11' and contacting the polysilicon pad 18' with metalization 21' and 28' and indium bumps 23' and 30'.

The steps illustrated in FIGS. 1–6, or FIGS. 9 and 10, are also performed with any number of other wafers 1. These other wafers are fabricated to have feedthroughs and/or indium bumps located in common positions so that they can be stacked, and the circuitry may be different on each wafer.

Figure 7:
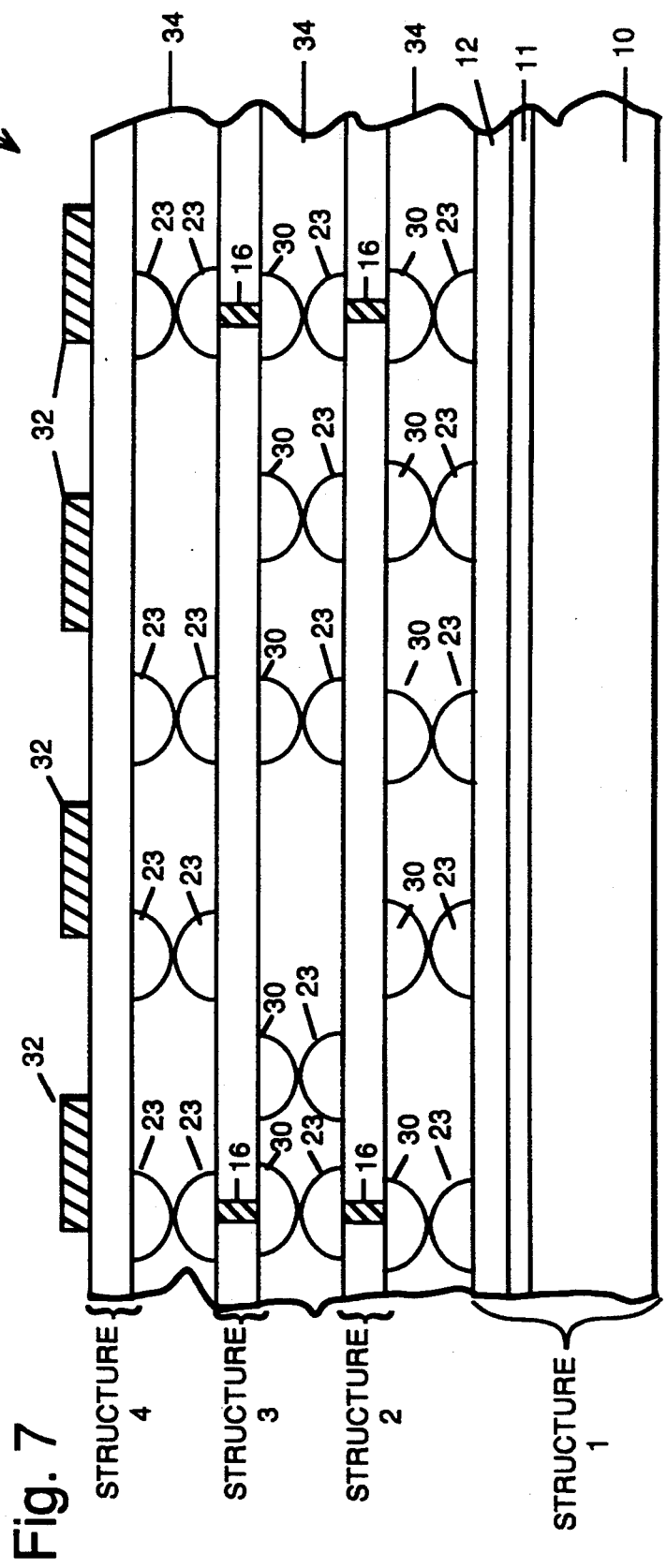

FIG. 7 shows a multiplicity of structures or wafers after stacking and interconnection to form a 3d integrated circuit assembly 40. Structure 1, at the bottom, provides rigid mechanical support for the overlying stack. Structure 1 may be identical to that shown in FIGS. 5 or 9, with the original silicon substrate 10 left in place to provide the mechanical support.

Alternatively, structure 1 may be any suitable Si or SOI wafer containing passive and/or active circuitry and interconnecting bumps on the top surface. Structures 2 and 3 are identical to that shown in FIGS. 6 or 10, with the original silicon substrate 10 and also the temporary silicon substrate 26 removed. Structure 4 is similar to that shown in FIGS. 6 or 10, with the exception of aluminum bonding pads 32 that have been fabricated on the topside surface instead of the indium bumps 23.

A presently preferred method for forming the 3d integrated circuit 40 is as follows. Using an infrared microscope, two processed wafers are aligned to each other such that the indium bumps 30 on the bottom of structure 2 are lined up with the indium bumps 23 on the top surface of structure 1. The indium bumps are then brought into contact and fused together. A conventional cold weld process can be used for interconnecting the indium bumps. Everywhere outside the fused indium bumps there will be an air gap approximately 5 to 15 micrometers thick, depending on the height of the bumps and the degree of compression that occurs during bump fusing. This gap is then filled with a suitable material 34, such as an epoxy adhesive, to provide mechanical support. The temporary substrate 26 is then removed from the top wafer (structure 2), exposing the indium bumps 23 on the topside surface.

Additional processed structures are then incrementally stacked on top of the underlying structures until a desired number of structures are incorporated into the 3d integrated circuit 40. Each additional structure added to the stack requires that its bottomside indium bumps 30 be fused to the topside indium bumps 23 of the structure below it, and then the temporary silicon substrate 26 removed from its top surface. These processes are repeated as often as required to build up the desired number of active layers.

In the embodiment shown in FIG. 7, no indium bumps are required on the top surface of the top structure. Rather, conventional technology is used to route the metal out to the bonding pads 32.

Figure 8:
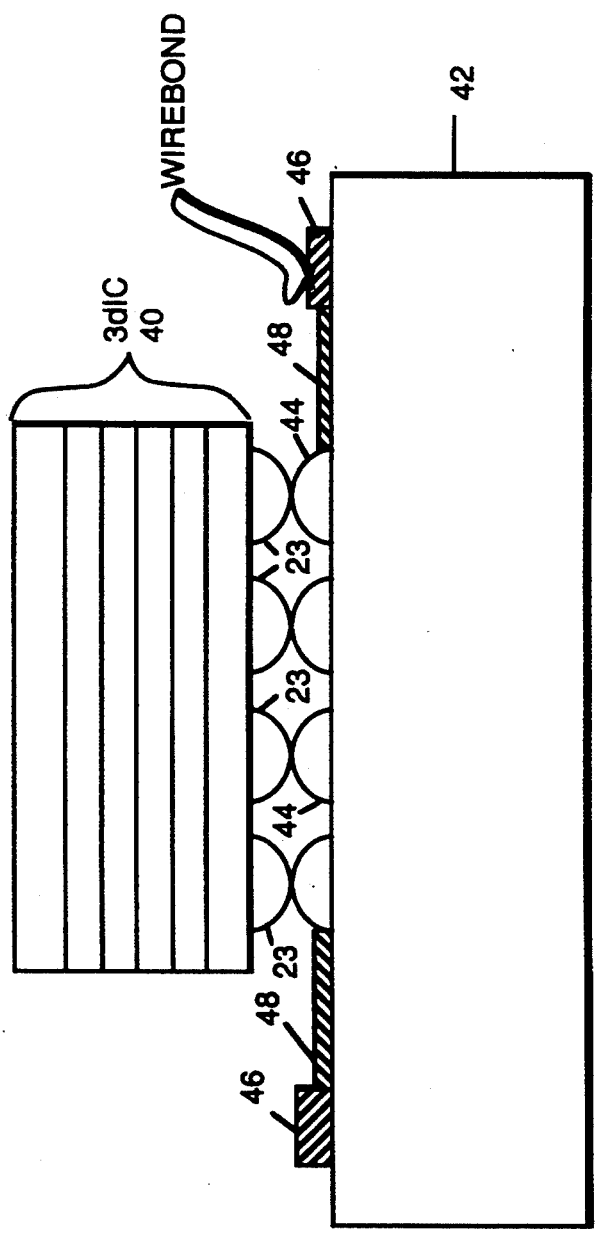
FIG. 8, not drawn to scale, illustrates an embodiment of a 3d integrated circuit assembly that is connected to a larger diameter carrier wafer.

Alternatively, and as is shown in FIG. 8, the entire 3d integrated circuit 40 can be bumped to a larger diameter wafer 42 through the topside indium bumps 23 of structure 4 and corresponding indium bumps 44 on the larger diameter wafer 42. The larger diameter wafer 42 is provided with bonding pads 46 that are located outside of the area or footprint of the 3d integrated circuit 40, and interconnecting metalization 48. Connection to external circuitry is then made through the bonding pads 46, as opposed to the bonding pads 32 of FIG. 7. Conventional wirebonds can be employed for interfacing to the 3d integrated circuit 40.

A consideration when stacking the structures is the overall yield of the individual dice or circuit areas upon each wafer. As such, the provision of redundant circuitry and interconnections may be advantageous in order to enable the elimination of defective circuits and the replacement of same with operational circuits. Wafer testing can be accomplished before applying the topside overglass and bumps. In that the bump formation is typically a high yield process, the subsequent processing to add the overglass and bumps does not adversely affect the wafer yield to a significant degree.

Referring again to FIGS. 6 and 10, it is within the scope of the invention to saw the processed Si film and temporary substrate 26 into individual dice, and then stack and interconnect the dice as described above for the case of the wafer-sized structures. It is also within the scope of the invention to fabricate the 3d integrated circuit 40 of FIG. 7, and to then subsequently saw the circuit into individual dice. In either case, each of the resulting 3d circuits includes a number of vertically stacked thin silicon layers each of which contains desired circuitry and interconnects between layers.

As can be realized, each structure of the 3d integrated circuit 40 can contain circuitry that differs from the circuitry of the other structures. Furthermore, the circuitry can be analog circuitry, such as amplifiers and mixers, or may be digital circuitry, such as memories and microprocessors. Also, several of the structures may contain analog circuitry while several others of the structures may contain digital circuitry. A mixture of analog and digital circuitry within a single structure is also possible. This enables the provision of a highly integrated, low volume device having mixed analog and digital functions.

It should also be realized that a given feedthrough 16 within one of the wafers is not required to be electrically coupled to any of the active or passive components that are fabricated within the Si layer 12 of that wafer. That is, a plurality of the feedthroughs 16 may pass through a number of wafers for vertically interconnecting circuitry within two non-adjacent wafers.

It should further be realized that the terms "topside" and "bottomside" are provided for reference purposes only, and are not intended to indicate in an absolute sense a final orientation of a particular one of the wafers or assemblage of wafers. Furthermore, the teaching of the invention is not limited for use only with silicon-based wafers. That is, the layer 12 within which the circuitry is formed may be comprised of a semiconductor material other than silicon, such as GaAs, the dielectric layer 11 may be other than $SiO_2$, and the bulk substrate 10 may be other than silicon. In this case the etching process is suitably adjusted so as to select an etchant that is effective for removing the bulk substrate material.

It is also pointed out that the interconnection means between individual active circuit layers are not required to be indium bumps. For example, solder bumps may be employed instead, and the process for joining individual ones of the structures together adjusted accordingly.

Thus, while the invention has been particularly shown and described with respect to preferred embodiments thereof, it will be understood by those skilled in the art that changes in form and details may be made therein without departing from the scope and spirit of the invention.

What is claimed is:

1. A method for fabricating a circuit assembly, comprising the steps of:
    (a) providing a multilayered wafer having a first substrate, an electrically insulating dielectric oxide layer overlying a surface of the first substrate, and a layer of semiconductor material overlying the dielectric oxide layer;
    (b) processing the semiconductor material layer to form at least one electrically conductive feedthrough through the semiconductor material layer and to form circuitry within the semiconductor material layer;
    (c) forming interconnection means that overlie the semiconductor material layer and that are electrically coupled to the at least one feedthrough;
    (d) attaching a temporary substrate such that the interconnection means are interposed between the semiconductor material layer and the temporary substrate;
    (e) removing the first substrate, the step of removing including a step of etching the first substrate so as to expose the dielectric oxide layer; and
    (f) forming further interconnection means through the exposed dielectric oxide layer for electrically coupling at least to the at least one feedthrough, thereby fabricating a first circuit assembly.

2. The method of claim 1 wherein the step of attaching includes a step of providing a protective material at a periphery of the multilayered wafer, the protective material protecting edges of the layer of semiconductor material during the step of etching.

3. The method of claim 1 wherein the first substrate is comprised of silicon, and wherein the step of etching employs a KOH solution.

4. The method of claim 1 wherein the step of etching employs plasma etching.

5. The method of claim 1 wherein the step of forming interconnection means includes an initial step of depositing an electrically insulating overglass layer on the semiconductor material layer.

6. The method of claim 1 wherein the step of removing the first substrate comprises the steps of first lapping and then etching the first substrate.

7. The method of claim 1 wherein steps of forming interconnection means and further interconnection means each include a step of forming an indium bump in registration with said at least one feedthrough, the indium bump being electrically coupled to said at least one feedthrough.

8. The method of claim 1 wherein steps of forming interconnection means and further interconnection means each include a step of forming at least one indium bump, the at least one indium bump being electrically coupled to said at least one feedthrough.

9. The method of claim 1 wherein steps of forming interconnection means and further interconnection means each include a step of forming at least one solder bump, the at least one solder bump being electrically coupled to said at least one feedthrough.

10. The method of claim 1 and further comprising a step of sawing the first circuit assembly into a plurality of smaller circuit assemblies, each of said smaller circuit assemblies including a portion of the temporary substrate, at least one interconnection means, and at least one further interconnection means.

11. The method of claim 10 and further comprising the steps of:
removing the portion of the temporary substrate from a first smaller circuit assembly;
stacking a second smaller circuit assembly upon the first smaller circuit assembly;
electrically interconnecting the further interconnection means of the second smaller circuit assembly to the interconnection means of the first smaller circuit assembly; and
removing the portion of the temporary substrate from the second smaller circuit assembly.

12. The method of claim 1 and further comprising the steps of:
removing the temporary substrate from the first circuit assembly; stacking a second circuit assembly upon the first circuit assembly, the second circuit assembly being fabricated in accordance with the steps (a) through (f);
electrically interconnecting the further interconnection means of the second circuit assembly to the interconnection means of the first circuit assembly; and
removing the temporary substrate from the second circuit assembly.

13. The method of claim 12 and further comprising the step of sawing the electrically interconnected first and second circuit assemblies into a plurality of smaller, electrically interconnected circuit assemblies.

14. A method for fabricating a three-dimensional integrated circuit assembly, comprising the steps of:
(a) providing a first multilayered wafer having a first substrate, an electrically insulating dielectric oxide layer overlying a surface of the first substrate, and a layer of semiconductor material overlying the dielectric oxide layer;
(b) processing the semiconductor material layer to form at least one electrically conductive feedthrough through the semiconductor material layer and to form circuitry as required within the semiconductor material layer;
(c) forming interconnection means that overlies the semiconductor material layer and that is electrically coupled to the at least one feedthrough;
(d) attaching the first wafer to a temporary substrate such that the interconnection means is interposed between the semiconductor material layer and the temporary substrate;
(e) removing the first substrate, the step of removing including a step of etching the first substrate so as to expose the dielectric oxide layer;
(f) forming further interconnection means through the exposed dielectric oxide layer for electrically contacting at least the at least one feedthrough, the step of forming further interconnection means resulting in a first circuit assembly that includes the processed semiconductor material layer, the interconnection means formed over a first major surface of the processed semiconductor material layer, and the further interconnection means formed over a second major surface of the processed semiconductor layer;
(g) coupling the further interconnection means to interconnection means of a second multilayered wafer, the second multilayered wafer including a supporting substrate disposed on a surface opposite to a surface that underlies the interconnection means of the second multilayered wafer; and
(h) removing the temporary substrate from the first circuit assembly.

15. The method of claim 14 wherein the first substrate is comprised of silicon, and wherein the step of etching employs a KOH solution.

16. The method of claim 14 wherein the step of etching includes a step of plasma etching.

17. The method of claim 14 and further comprising the steps of:
(i) coupling the further interconnection means of a second circuit assembly to the interconnection means of the first circuit assembly, thereby forming a stack of circuit assemblies, the second circuit assembly being fabricated in accordance with steps (a) through (f); and
(j) removing a temporary substrate from the second circuit assembly.

18. The method of claim 17 and, after repeating steps (i) and (j) until a last circuit assembly is coupled to the stack of circuit assemblies, further comprising a step of coupling the interconnection means of the last circuit assembly to interconnection means disposed over a major surface of a further substrate, the major surface of the further substrate having a surface area that is greater than a surface area of the first major surface of an individual one of circuit assemblies of the stack of circuit assemblies, the further substrate being provided with electrical contact means for coupling the stack of circuit assemblies to other circuitry.

19. The method of claim 17 and, after repeating steps (i) and (j) until a last circuit assembly is coupled to the stack of circuit assemblies, the last circuit assembly includes electrical contact means for coupling the stack of circuit assemblies to other circuitry.

20. The method of claim 14 wherein the step of forming interconnection means includes an initial step of depositing an electrically insulating overglass layer on the semiconductor material layer.

21. The method of claim 14 wherein the step of removing the first substrate comprises the steps of first lapping and then etching the first substrate.

22. The method of claim 14 wherein steps of forming interconnection means and further interconnection means each include a step of forming an indium bump that is electrically coupled to the at least one feedthrough.

23. The method of claim 14 wherein steps of forming interconnection means and further interconnection means each include a step of forming a solder bump that is electrically coupled to the at least one feedthrough.

24. The method of claim 17 and, after repeating steps (i) and (j) until a last circuit assembly is coupled to the stack of circuit assemblies, further comprising a step of sawing the stack of circuit assemblies into a plurality of stacks of circuit assemblies.

* * * * *